(12) United States Patent
Sriram et al.

(10) Patent No.: US 11,030,375 B2
(45) Date of Patent: Jun. 8, 2021

(54) CAPTURING ROUTING INTENT BY USING A MULTI-LEVEL ROUTE PATTERN DESCRIPTION LANGUAGE

(71) Applicant: Synopsys, Inc., Mountain View, CA (US)

(72) Inventors: Mysore Sriram, Bangalore (IN); Anuradha Agarwal, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 11 days.

(21) Appl. No.: 16/522,385

(22) Filed: Jul. 25, 2019

(65) Prior Publication Data

US 2020/0034509 A1 Jan. 30, 2020

(30) Foreign Application Priority Data

Jul. 26, 2018 (IN) .............................. 201811028062

(51) Int. Cl.
*G06F 30/394* (2020.01)
*G06F 30/33* (2020.01)
*G06F 30/327* (2020.01)
*G06F 30/31* (2020.01)

(52) U.S. Cl.
CPC .......... *G06F 30/394* (2020.01); *G06F 30/327* (2020.01); *G06F 30/33* (2020.01); *G06F 30/31* (2020.01)

(58) Field of Classification Search
CPC ...... G06F 30/394; G06F 30/33; G06F 30/327; G06F 30/31

USPC .................... 716/129, 130, 139, 102; 703/14
See application file for complete search history.

(56) References Cited

U.S. PATENT DOCUMENTS

| | | | | |
|---|---|---|---|---|
| 6,009,250 A | * | 12/1999 | Ho | G06F 30/398 716/52 |
| 6,011,911 A | * | 1/2000 | Ho | G06F 30/398 716/112 |
| 7,650,574 B2 | * | 1/2010 | Nattinger | G06F 11/323 715/763 |
| 9,830,414 B2 | * | 11/2017 | Saghizadeh | G06F 30/36 |
| 2004/0061701 A1 | * | 4/2004 | Arquie | H04L 43/0882 345/440 |
| 2005/0229126 A1 | * | 10/2005 | Wang | G06F 30/398 716/112 |
| 2007/0022399 A1 | * | 1/2007 | Tsai | G06F 30/30 716/102 |
| 2009/0265684 A1 | * | 10/2009 | Fuchs | G06F 8/34 717/105 |
| 2009/0292387 A1 | * | 11/2009 | Funakoshi | G06F 3/0481 700/110 |
| 2010/0031212 A1 | * | 2/2010 | Dong | G06F 30/00 716/100 |

(Continued)

*Primary Examiner* — Phallaka Kik
(74) *Attorney, Agent, or Firm* — Park, Vaughan, Fleming & Dowler LLP; Laxman Sahasrabuddhe

(57) ABSTRACT

Techniques and systems for capturing and using routing intent in an integrated circuit (IC) design are described. Some embodiments use a graphical user interface (GUI) to capture routing intent for a net, wherein the routing intent includes a set of circuit objects associated with the net, a routing pattern, and optionally a set of user-provided attribute values. Next, the embodiments provide the routing intent to a router, wherein the router uses the routing intent to route the net.

20 Claims, 5 Drawing Sheets

(56) References Cited

U.S. PATENT DOCUMENTS

| | | | | |
|---|---|---|---|---|
| 2012/0134364 A1* | 5/2012 | Coppola | ................. | H04L 49/25 |
| | | | | 370/400 |
| 2013/0125072 A1* | 5/2013 | Newcomb | ............... | G06F 30/30 |
| | | | | 716/107 |
| 2014/0123094 A1* | 5/2014 | Colwell | ................ | G06F 30/394 |
| | | | | 716/126 |
| 2014/0184594 A1* | 7/2014 | Janvier | ................. | G06T 17/005 |
| | | | | 345/420 |
| 2019/0238432 A1* | 8/2019 | Parag | ................. | H04L 41/0631 |

* cited by examiner

CAPTURING ROUTING INTENT BY USING A MULTI-LEVEL ROUTE PATTERN DESCRIPTION LANGUAGE

RELATED APPLICATION

This application claims priority, under 35 U.S.C. § 119(a), to Indian Provisional Patent Application Ser. No. 201811028062, filed on 26 Jul. 2018, the contents of which are herein incorporated by reference in their entirety for all purposes.

COPYRIGHT NOTICE

The assignee of this patent document has no objection to the facsimile reproduction of the patent document as it appears in the files of the United States Patent and Trademark Office, but otherwise reserves all rights whatsoever in any included works of authorship protected by copyright.

BACKGROUND

Technical Field

This disclosure relates to integrated circuits (ICs). More specifically, this disclosure relates to techniques and systems for capturing routing intent by using a Multi-Level Route Pattern Description Language (ML-RPDL).

Related Art

Routers (also known as "automatic routers") provide huge productivity benefits relative to hand-drawing a layout, especially on newer technology nodes. Custom layout designers (hereinafter also referred to as "IC designers" or "designers") hesitate to use routers because the results can be unpredictable. Custom layout designers often have a specific routing intent in mind for each signal wire, and need to have an intuitive way to communicate this intent as guidance to the router, so that the router can use the guidance to produce optimal and predictable results.

Some types of guidance are too abstract, e.g., layer costs. This type of guidance can be transferred across design versions, but the user may not get the result they had in mind. On the other hand, some types of guidance are too detailed, e.g., precise coordinates of the routes. This type of guidance takes too much effort to create, and worse, the guidance can become obsolete with each small change in the design.

Because of the above-mentioned problems, the efficiency benefit of using a router may be significantly reduced in custom layout design.

SUMMARY

This section is not intended to limit the scope of the disclosed subject matter. The disclosed subject matter is to be accorded the widest scope consistent with the principles and features disclosed in the entire disclosure. Some embodiments described herein provide techniques and systems to capture a custom layout designer's routing intent in an intuitive, visual, and sufficiently abstract way, and to use this captured intent to guide a router for maximizing the productivity of a custom layout design flow. In particular, some embodiments described herein provide techniques and systems to capture custom routing intent by using an ML-RPDL.

Some embodiments can use a graphical user interface (GUI) to capture routing intent for a net by iteratively performing a set of operations, the set of operations comprising: (1) displaying an IC design that includes a set of circuit objects associated with the net, and a set of routing pattern identifiers, (2) receiving a selection of a subset of the set of circuit objects, and a routing pattern identifier, (3) applying a routing pattern corresponding to the routing pattern identifier to the subset of the set of circuit objects to obtain a mapped topology, the mapped topology comprising a set of nodes corresponding to the subset of the set of circuit objects, and a set of edges corresponding to interconnections between the subset of the set of circuit objects, and (4) displaying the mapped topology with the IC design. Next, the embodiments can provide the routing intent to a router, wherein the router uses the routing intent to route the net.

In some embodiments, the set of operations also include displaying an attribute editor that allows a user to input attribute values associated with the net, and receiving a set of attribute values associated with the net.

In some embodiments, the routing intent includes the set of circuit objects associated with the net, the routing pattern, and the set of attribute values.

In some embodiments, the input attribute values include physical, electrical, and/or connectivity attribute values.

In some embodiments, the set of routing pattern identifiers includes: a first icon corresponding to a spanning tree routing pattern, a second icon corresponding to a star routing pattern, a third icon corresponding to a chain routing pattern, and a fourth icon corresponding to a trunk routing pattern.

In some embodiments, each circuit object in the set of circuit objects is either a pin or another routing intent.

In some embodiments, providing the routing intent to the router comprises generating a set of routing constraints based on the routing intent, and providing the set of routing constraints to the router.

DETAILED DESCRIPTION

Figure 1A:
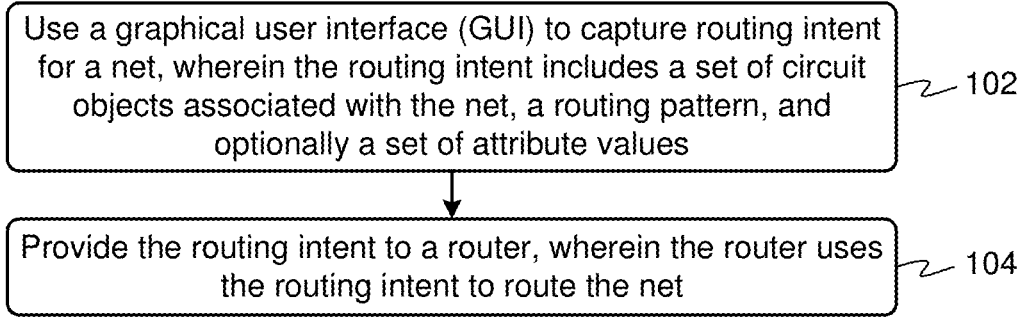
FIG. 1A illustrates a process for capturing and using routing intent in accordance with some embodiments described herein.

The following description is presented to enable any person skilled in the art to make and use the claimed invention(s), and is provided in the context of particular application(s) and/or environment(s). Various modifications to the disclosed embodiments will be readily apparent to those skilled in the art, and the general principles defined herein may be applied to other embodiments and applications without departing from the spirit and scope of the disclosure. Thus, the disclosed subject matter is not limited to the embodiments shown, but is to be accorded the widest scope consistent with the principles and features disclosed herein.

In this disclosure, numerous specific details may be described to enable one or more of the embodiments. In the interest of not obscuring the presentation of the embodiments, some features that are known in the art may be combined together, may be described in less detail, or may be implied (i.e., some well-known features may not be explicitly described). Furthermore, while this description may refer to some features in the singular tense, more than one instance of the feature may be illustrated in the figures, and like components are labeled with like numerals.

Overview of IC Design and Manufacturing

An IC design and manufacturing process produces IC chips. IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results.

As an IC design progresses through an IC design flow, the IC design can be represented at different levels of abstraction by using different data formats or languages. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (i.e., the description of the IC design becomes more specific as the IC design progresses through the IC design flow).

For example, toward the beginning of the IC design flow, an IC design can be described at a high level of abstraction by using a hardware description language (HDL) which describes the functionality of the IC design but does not include information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between these two ends of the IC design flow, the IC design may be represented in numerous data formats or languages that describe the same IC design at different levels of abstraction.

Some examples of IC design steps and the associated software tools are described below. These examples are for illustrative purposes only and are not intended to limit the embodiments to the forms disclosed. This disclosure describes techniques and systems that can be used in one or more IC design steps.

IC design software tools enable IC designers to describe the functionality that the IC designers want to implement. These tools also enable IC designers to perform what-if planning to refine functionality, check costs, etc. During logic design and functional verification, the HDL, e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence (i.e., equivalence checking) with the RTL design and/or HDL code.

During design planning, an overall floorplan for the chip can be constructed and analyzed for timing and top-level routing. During physical implementation, circuit elements can be positioned in the layout and can be electrically connected.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

As mentioned above, the HDL code can be translated to a netlist during synthesis. A netlist describes a network of logical building blocks (e.g., AND gates, OR gates, MUXs, etc.) that implement the desired functionality of the IC design. After the synthesis stage, the IC design flow can perform placement, during which the network of logical building blocks is implemented by using a network of cells. A cell represents an actual portion of the physical IC chip that will be created when the IC design is manufactured. Placement involves assigning a physical location to each cell in the IC design. After placement, the IC design flow can perform routing, which involves determining routes for metal wires to electrically connect the placed cells.

A netlist is a list (or collection) of "nets." Each "net" refers to a set of gates (or cells) whose inputs/outputs are electrically connected. For example, suppose a driver cell drives the inputs of a set of driven cells. In this example, the term "net" can refer to the portion of the netlist that includes the driver cell, the set of driven cells, and the electrical connections (e.g., the network of metal wires) that connect the output of the driver cell and the inputs of the set of driven cells. Each of these steps—synthesis, placement, and routing—is complex and includes multiple sub-steps. During an actual IC design flow, multiple iterations may be required before the IC design converges and meets the desired performance and yield targets.

Capturing Routing Intent Using an ML-RPDL

Custom layout designers need an intuitive way to communicate their routing intent to the router, thereby enabling the router to produce optimal and predictable results. The form of the routing intent or guidance should satisfy the following objectives: (1) the routing intent should be visual because custom layout designers tend to prefer visual control over textual or scripted approaches, and (2) the routing intent should be sufficiently abstract, meaning that if the design changes slightly, the routing provided earlier should still be valid and capable of being used by the router to produce routes that match the routing intent.

Embodiments described herein enable a user to quickly capture routing intent as follows: (1) select a set of circuit objects of the net, (2) select a routing pattern, from a predefined palette, to apply to the objects, (3) examine the resulting topology which is immediately displayed in the layout, and (4) if needed, choose a different pattern from the palette, or change the attributes of the pattern, until the displayed topology matches the desired routing intent.

The routing intent (which comprises a list of objects, a pattern, and a list of attributes) is attached to the net and saved along with the IC design. It can be used to drive the router to create predictable routing which matches what the custom layout designer had in mind. In most cases, when the design changes (due to changes in netlist, placement, device sizes, etc.), the routing intent remains valid, and the router can be re-run using the saved intent without requiring any redesign effort.

Embodiments described herein separate the routing intent into three independent components:

Clustering intent. This captures how the designer wants objects of the net to be grouped together. By allowing objects to include other clusters, it is possible to recursively build up a hierarchy of groups, e.g., a cluster of clusters, and so on. This kind of hierarchical grouping closely matches how a layout designer thinks about the routing problem.

Connectivity intent. The routing pattern captures the way in which the designer wants the objects in a cluster to be connected together—e.g., in a daisy-chain, or as spokes radiating from a central hub.

Physical intent. If the designer has specific requirements for the physical route characteristics (such as width, metal layer, relative location, shape, etc.), then these are captured as attributes on the overall pattern, or on individual connectivity edges in the pattern.

Embodiments described herein are designed to maximize the productivity of a custom layout designer. The clear separation of the three types of intent—clustering, connectivity, and physical—enables quick and intuitive capture of routing intent. Some embodiments provide an immediate visual feedback to the user as they modify each intent component, which helps minimize surprises in the routing solution produced by the router. Additionally, some embodiments provide reasonable default values for each of these intent components to minimize unnecessary and repetitive user input.

Some embodiments provide for a graceful degradation of intent applicability if the design changes: small changes may only invalidate a few attributes, larger changes may invalidate clustering intent, while the connectivity intent will stay valid after almost any change. Specifically, whenever an intent is invalidated due to changes to the design, the user is alerted, and is given the option to see the impact visually and make adjustments to the part that changed and caused the routing intent to be invalidated. These embodiments are thus able to robustly handle the changes that occur during the natural evolution of a design.

FIG. 1A illustrates a process for capturing and using routing intent in accordance with some embodiments described herein.

The process can begin by using a GUI to capture routing intent for a net, wherein the routing intent includes a set of circuit objects associated with the net, a routing pattern, and optionally a set of attribute values (operation 102). Next, the process can provide the routing intent to a router, wherein the router uses the routing intent to route the net (operation 104).

Figure 1B:
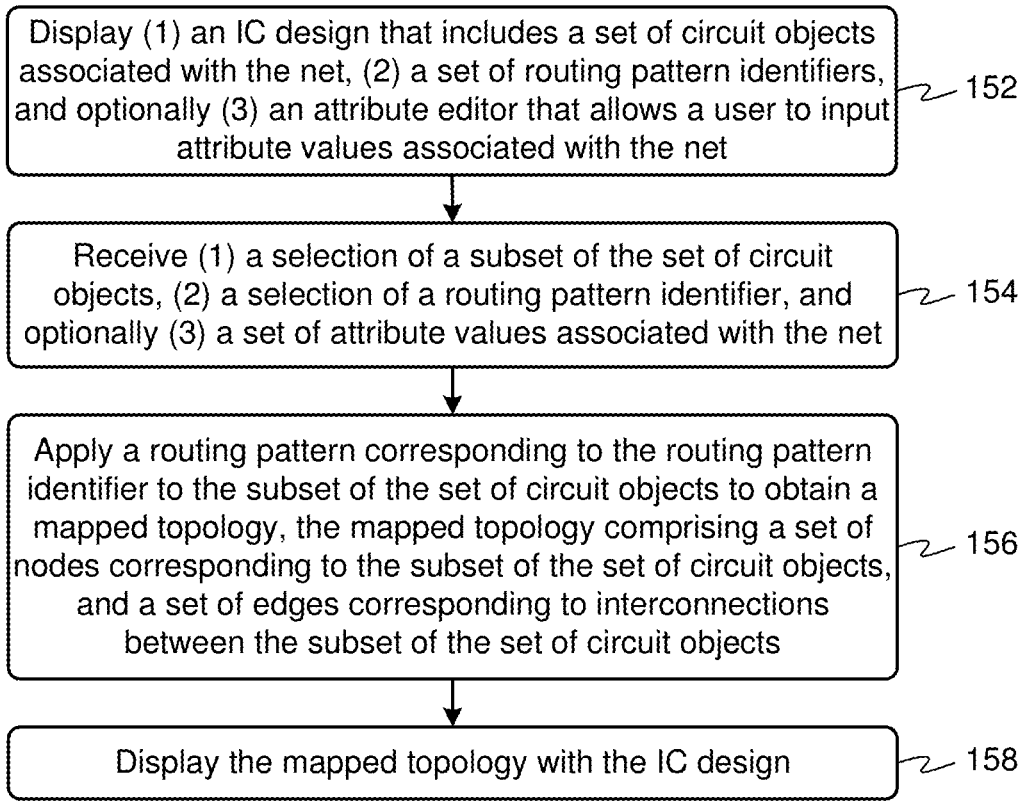
FIG. 1B illustrates a process for using an interactive GUI to capture routing intent in accordance with some embodiments described herein.

FIG. 1B illustrates a process for using an interactive GUI to capture routing intent in accordance with some embodiments described herein. The set of operations illustrated in FIG. 1B are not all-inclusive, and embodiments may include additional operations. Additionally, the set of operations illustrated in FIG. 1B can be performed iteratively, thereby allowing a user to interactively explore different routing intents until the user is satisfied.

The process can begin by displaying (1) an IC design that includes a set of components referred to herein as circuit objects associated with the net, (2) a set of routing pattern identifiers, and optionally (3) an attribute editor that allows a user to input attribute values associated with the net (operation 152).

Each circuit object in the set of circuit objects is either a pin or another routing intent. This allows the system to recursively define routing intents, thereby implementing hierarchical or multi-level routing intents.

In some embodiments, displaying the set of routing pattern identifiers can comprise displaying a palette of icons, the palette of icons comprising: a first icon corresponding to a spanning tree routing pattern, a second icon corresponding to a star routing pattern, a third icon corresponding to a chain routing pattern, and a fourth icon corresponding to a trunk routing pattern.

In some embodiments, the input attribute values include physical, electrical, and/or connectivity attribute values.

Next, the process can receive (1) a selection of a subset of the set of circuit objects, (2) a selection of a routing pattern identifier, and optionally (3) a set of attribute values associated with the net (operation 154).

The process can then apply a routing pattern corresponding to the routing pattern identifier to the subset of the set of circuit objects to obtain a mapped topology, the mapped topology comprising a set of nodes corresponding to the subset of the set of circuit objects, and a set of edges corresponding to interconnections between the subset of the set of circuit objects (operation 156). Next, the process can display the mapped topology with the IC design (operation 158).

In operation 102 of FIG. 1A, the routing intent can be captured by using ML-RPDL. The syntax of an example ML-RPDL can be defined as follows:

intent:=[<objects>]<pattern>[<attributes>]
object:=<pin(s)>|<intent>
attribute:=
   <physical_attr.>|<electrical_attr.>|<connectivity_attr.>

The "intent" keyword is used to represent a routing intent object. The "object" keyword can either be one or more pins, or another routing intent object. The above syntax (which includes a recursion between "intent" and "object" keywords) allows multi-level or hierarchical routing intents to be defined in a recursive fashion. Specifically, this recursive reference feature enables ML-RPDL to easily express arbitrarily complex routing intents, built up as a hierarchy of simpler patterns.

The "pattern" keyword is selected from a pre-defined list of standard pattern labels, such as "spanning_tree," "star", "trunk", "chain," etc. The list of objects is optional, and is represented by "[<objects>]" in the syntax (the square brackets [ ] signify the optional nature). The list of objects can specify all or some of the pins of a net to which the specified pattern is applied. The list of objects can also include a previously defined routing intent object.

Figure 2A:
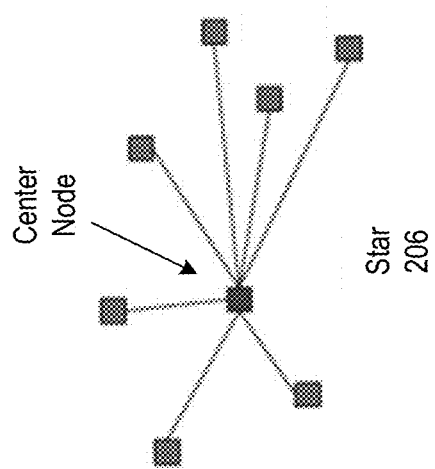
FIG. 2A illustrates examples of routing patterns in accordance with some embodiments described herein.
Figure 2A:
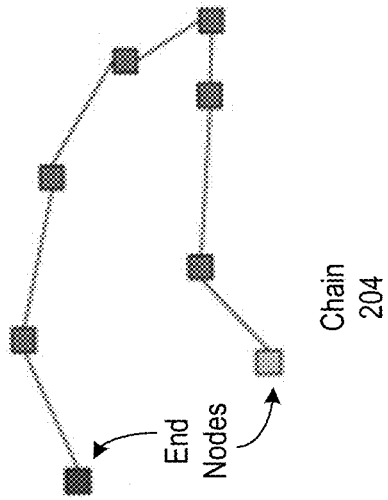
Figure 2A:
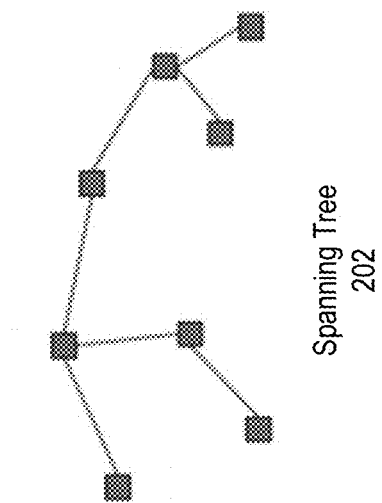

FIG. 2A illustrates examples of routing patterns in accordance with some embodiments described herein. The routing patterns shown in FIG. 2A are not intended to be exhaustive. In some embodiments, the user may also be allowed to define new custom patterns via the GUI. In FIG. 2A, each object is represented by a node (shown as a shaded square in FIG. 2A), and an interconnection between two objects is represented by an edge (shown as a line interconnecting two shaded squares in FIG. 2A). Spanning tree pattern 202 interconnects the set of nodes (which correspond to the set of objects) by using a spanning tree. Chain pattern 204 interconnects the set of nodes by using a chain, i.e., a path from one end node to the other end node. In some embodiments, the GUI can enable a user to specify the two end nodes of the chain, and the system can interconnect the set of nodes by determining a sequence of edges that begins at one end node, ends at the other end node, and in between passes through the remaining set of nodes. Star pattern 206 interconnects a center node in the set of nodes with the remaining nodes in the set of nodes.

Pins are components that can be specified either by explicit reference to a circuit design object, or by region. The region coordinates can be either absolute coordinates, or relative coordinates (such as a percentage of the net or design bounding box). Relative coordinates allow the routing intent specification to adapt to changes in the floorplan. Pins can also be "virtual," i.e., they can refer to arbitrary (x, y, metal-layer) locations or edges of blocks in the design, enabling the system to be used for early design planning when actual physical pins have not yet been created in the IC design. Finally, if no objects are specified in the routing intent specification, then the routing pattern is assumed to apply to all pins of the net for which the routing intent specification is being created.

The list of attributes is also optional, and each "attribute" keyword is selected from a set of physical, electrical, and connectivity attributes. Examples of physical attributes include metal layer range, width and spacing values, path shape (such as L, Z, U etc.), and relative coordinates of pattern-specific features (such as trunks). Electrical attributes can specify design intent related to electrical characteristics of the route, e.g., shielding, redundant routing, and length matching. Connectivity attributes relate to how the objects are connected to each other. Specifically, in a multi-level routing intent definition, connectivity attributes can specify how a routing intent at a given level of the hierarchy connects to another routing intent at a higher level. In particular, each pattern can have a default "port," which is the node in the pattern that is used to interconnect with another node of a higher level pattern. For example, the default port for a star pattern would be its center node. By specifying a port attribute, it is possible to change the default connection node. If no attributes are specified, the embodiment can define default attributes that are considered to be reasonable based on the pattern and object list.

Figure 2B:
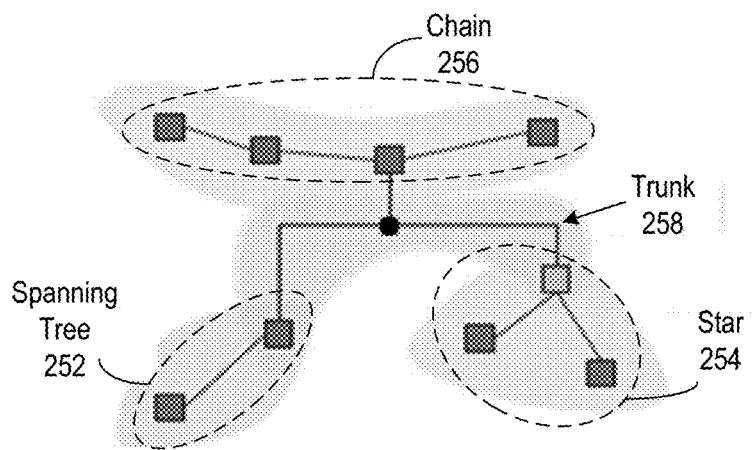
FIG. 2B illustrates an example of how a multi-level pattern can be defined using an ML-RPDL in accordance with some embodiments described herein.

FIG. 2B illustrates an example of how a multi-level pattern can be defined using an ML-RPDL in accordance with some embodiments described herein. In FIG. 2B, the upper-level routing intent object uses trunk pattern 258, and interconnects three lower-level routing intent objects that use spanning tree pattern 252, star pattern 254, and chain pattern 256, respectively. Note that the center node of star pattern 254 (which is the default "port" of a star pattern) is interconnected with the higher-level trunk pattern 258.

Figure 3:
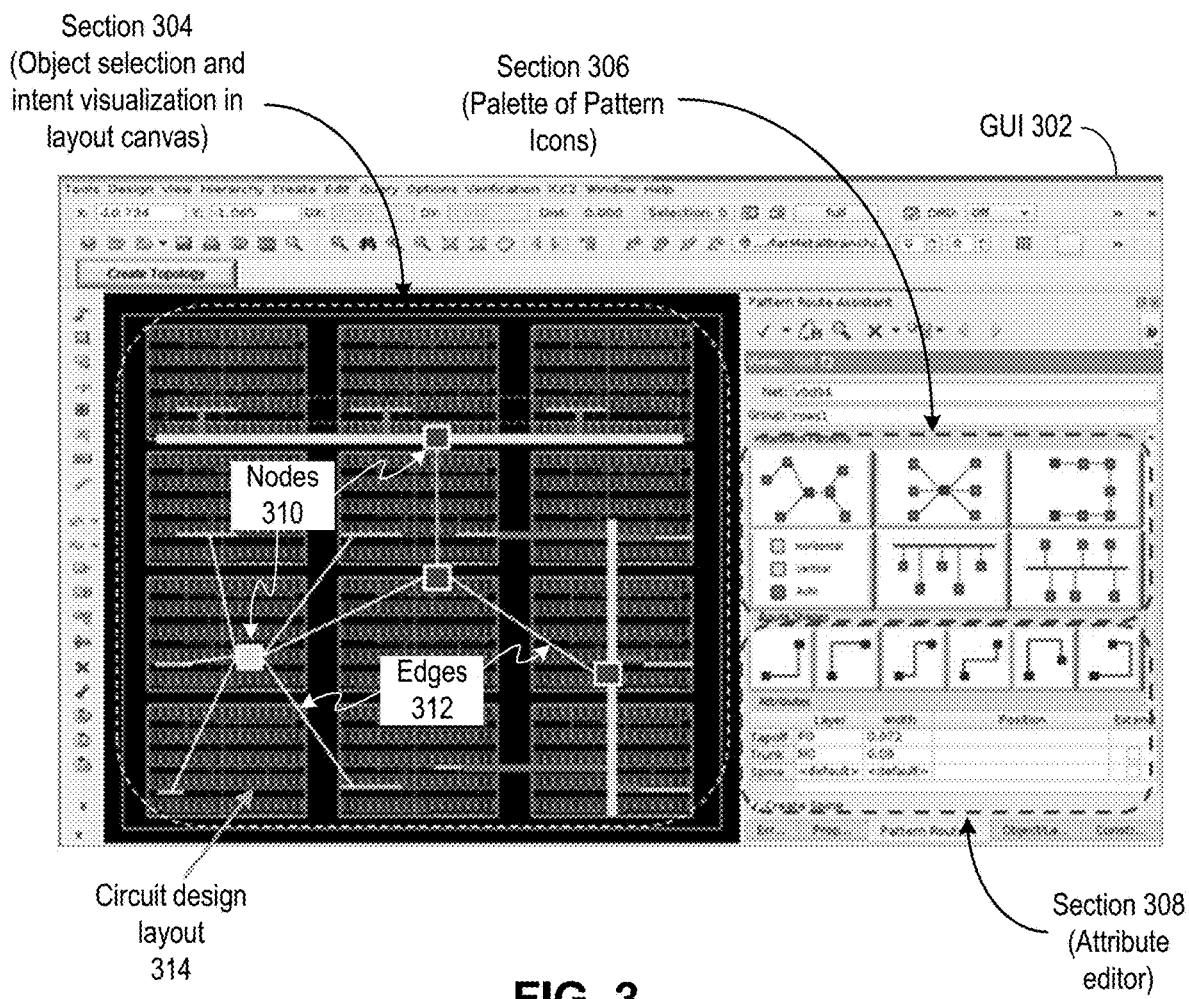
FIG. 3 illustrates a GUI that can be used to capture routing intent in accordance with some embodiments described herein.

FIG. 3 illustrates a GUI that can be used to capture routing intent in accordance with some embodiments described herein. GUI 302 includes section 304 for object selection and intent visualization in layout canvas, section 306 that includes a palette of pattern icons, and section 308 which includes an attribute editor. Section 304 allows object selection and intent visualization in layout canvas. Specifically, section 304 can overlay nodes 310 and edges 312 on top of the circuit design layout 314, thereby allowing the user to easily see the routing intent in GUI 302. Recall that nodes 310 and edges 312 are part of the mapped topology that is determined by applying the selected routing pattern to the selected objects (see operation 156 in FIG. 1B). In section 306, the palette of pattern icons can allow selection of a particular routing pattern by using a pointing device. Attribute editor in section 308 can allow a user to input attribute values that are associated with the net for which the routing intent specification is being created.

Once created, the routing intent specification can be associated with a net or a set of nets in the IC design. For example, the routing intent specification can be saved as a property of the net or the set of nets. As the IC design evolves, the routing intent specification can be used to re-generate a routing solution that satisfies design-rules and is in accordance with the routing intent.

Using the routing intent specification to generate design-rule clean routing comprises two steps: (1) mapping the routing intent specification to a mapped topology, and (2) using the mapped topology to perform routing on the net.

The mapping step converts an ML-RPDL specification into a mapped topology, which comprises a set of nodes at absolute coordinates, and edges connecting the nodes. Routing intent specifications are processed in bottom-up order, i.e., lower level routing intent specifications are processed before higher level routing intent specifications. At each level in the routing intent hierarchy, the following operations are performed on the routing intent that is specified in the above-mentioned pattern-objects-attributes format: (1) the selected objects are mapped to a specific set of circuit objects in the design, (2) the pattern is mapped to a set of nodes that represent the circuit objects that were determined in the previous step, (3) edges are created to connect the nodes in accordance with the routing pattern specified in the routing intent, and (4) node and edge properties are modified based on the attribute values specified in the routing intent. Techniques for connecting nodes according to a routing pattern, e.g., minimum spanning tree, are well-known in the graph theory art.

When a routing intent is associated with a set of nets, a master ML-RPDL specification can be defined for a master net, and then the master ML-RPDL specification can be copied to all nets in the set. Next, the routing intent specification is converted into a mapped topology for each net individually.

Once the mapped topologies have been created for the nets, then the nets can be routed in the order they are stored in the routing database. Techniques for routing in IC design are well-known, e.g., maze routing (C. Y. Lee, "An algorithm for path connection and its application," in IRE Trans. on Electronic Computer, 10, pp. 346-365, 1961), line-search routing (K. Mikami and K. Tabuchi, "A computer program for optimal routing of printed circuit connectors," in Proc. Int. Federation for Information Processing, pp. 1475-1478, November 1968), and A*-search based routing (G. W. Clow, A global routing algorithm for general cells, in Proc. ACM/IEEE Design Automation Conf., pp. 45-51, June 1984; M. Pan and C. N. Chu, "FastRoute 2.0: A high-quality and efficient global router," in Proc. IEEE/ACM Asian and South Pacific Design Automation Conf., pp. 250-255, January 2007). The above-mentioned documents are herein incorporated by reference to provide details of routing techniques.

Modern routers allow a user to provide a set of constraints or cost functions to guide routing. Specifically, the router is required to find routes that satisfy the set of constraints (or to minimize the total cost of the routes). In some embodiments described herein, the mapped topology is converted into constraints or cost functions that cause the router to choose routes that try to minimize the deviation between the routing solution and the mapped topology. Specifically, in some embodiments, the mapped topology for each net is used to create bias-line constraints or cost functions for the router. The router then determines design-rule clean routes for each net while trying to keep the route segments as close to the bias-lines as possible.

Figure 4A:
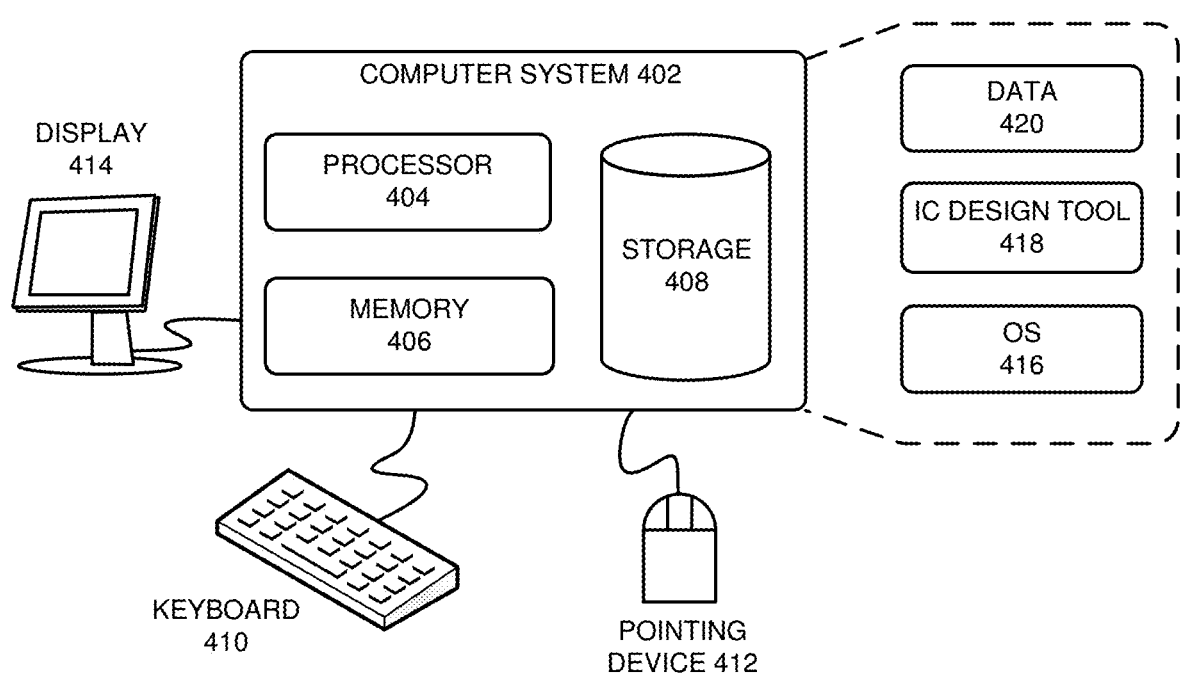
FIG. 4A illustrates a computer system in accordance with some embodiments described herein.

FIG. 4A illustrates a computer system in accordance with some embodiments described herein. The term "computer" or "computer system" generally refers to a hardware-based system that can perform computations required for the design and manufacture of ICs. Computer system 402 can include processor 404, memory 406, and storage device 408. Computer system 402 may include multiple processors, and processor 404 may include multiple cores. Specifically, memory locations in memory 406 can be addressable by processor 404, thereby enabling processor 404 to access (e.g., via load/store instructions) and manipulate (e.g., via logical/floating point/arithmetic instructions) the data stored in memory 406. Computer system 402 can be coupled to display device 414, keyboard 410, and pointing device 412. Storage device 408 can store operating system 416, IC design tool 418, and data 420. Data 420 can include input required by IC design tool 418 and/or output generated by IC design tool 418.

Computer system 402 may automatically (or with user help) perform one or more operations that are implicitly or explicitly described in this disclosure. Specifically, computer system 402 can load IC design tool 418 into memory 406, and IC design tool 418 can then be used to capture a custom layout designer's routing intent in an intuitive, visual, and sufficiently abstract way, and then use this captured intent to guide a router to produce a routing solution that closely matches the original routing intent of the custom layout designer. The resulting IC chips can have better performance, manufacturing yield, and/or quality because the custom layout designer's routing intent was captured and used to create wire routes in the IC chips.

The computer system can be structured as a server, a client, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine with instructions that specify actions to be taken by that machine. The term 'server', as used herein, refers to a computer or processor that typically performs processes for, and sends data and information to, another computer or processor.

A computer system typically is structured, in part, with at least one operating system program, such as Microsoft's Windows, Sun Microsystems's Solaris, Apple Computer's MacOs and iOS, Google's Android, Linux and/or Unix. The computer system typically includes a Basic Input/Output System (BIOS) and processor firmware. The operating system, BIOS and firmware are used by the processor to structure and control any subsystems and interfaces connected to the processor. Typical processors that enable these operating systems include: the Pentium, Itanium and Xeon processors from Intel; the Opteron and Athlon processors from Advanced Micro Devices; the Graviton processor from Amazon; the POWER processor from IBM; the SPARC processor from Oracle; and the ARM processor from ARM Holdings.

The claimed inventions and their embodiments are limited neither to an electronic digital logic computer structured with programs nor to an electronically programmable device. For example, the claimed inventions can use an optical computer, a quantum computer, an analog computer, or the like. Further, where only a single computer system or a single machine is signified, the use of a singular form of such terms also can signify any structure of computer systems or machines that individually or jointly use processes. Due to the ever-changing nature of computers and networks, the description of computer system is intended only as an example. Many other structures of computer system have more or less components than the computer system depicted in FIG. 4A. An article of manufacture, for example, an integrated circuit created by using one or more of the claimed inventions and their tangible forms that are specified by the Specification and Figures.

Figure 4B:
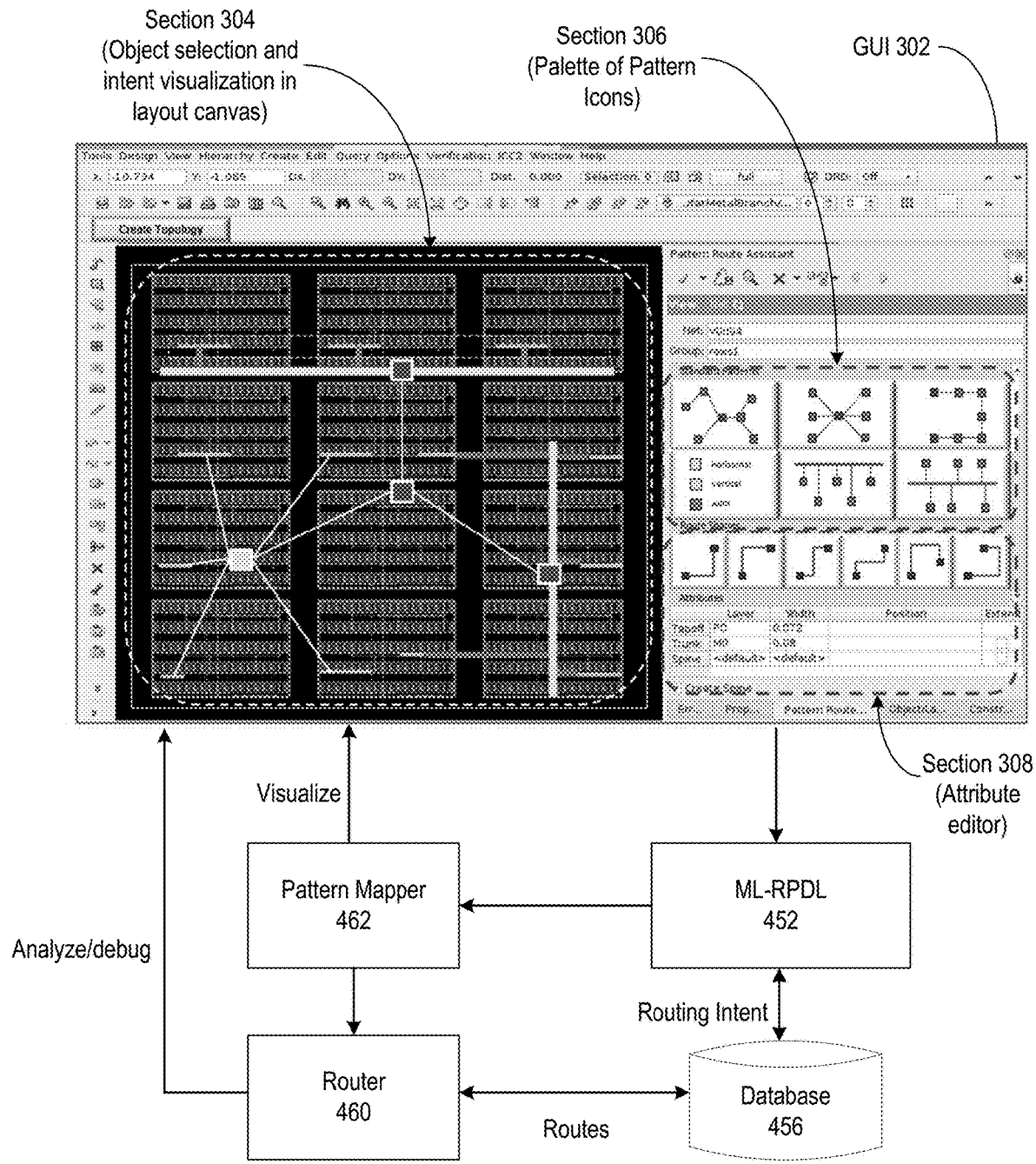
FIG. 4B illustrates components of an example routing intent capture and realization system in accordance with some embodiments described herein.

FIG. 4B illustrates components of an example routing intent capture and realization system in accordance with some embodiments described herein. The system illustrated in FIG. 4B can be implemented using one or more computer systems shown in FIG. 4A.

The example system in FIG. 4B includes GUI 302, which includes section 304 to enable object selection and intent visualization in the IC design layout canvas, section 306 to enable selection of a pattern icon from a palette of pattern icon, and section 308 to enable a user to input attribute values via an attribute editor.

The routing intent obtained by using GUI 302 can be stored in database 456. The routing intent can be specified using ML-RPDL 452, which captures the objects, patterns, and attributes in a routing intent object that is associated with a net. The routing intent object can be stored in database 456 as a property of the net. Pattern mapper 462 can convert routing patterns and relative coordinates into mapped topologies with absolute coordinates and display them via GUI 302, thereby enabling a custom layout designer to interactively explore different options, and converge on a desired routing intent. Router 460 can convert the mapped topologies generated by pattern mapper 462 into design-rule clean detailed routes, which can be stored in database 456. The design-rule clean detailed routes can then be displayed, analyzed, and debugged via GUI 302.

DETAILED DESCRIPTION—TECHNOLOGY SUPPORT FROM DATA/INSTRUCTIONS TO PROCESSORS/PROGRAMS

Data and Information.

While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32 F.3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. Many forms of knowledge, learning, skills and styles are authored, structured, and enabled—objectively—as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about at the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more ('ensemble') electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a wire with one end attached to the component and the other end attached to another component, typically as part of a circuit with current flows. There are at least three types of electrical components: passive, active and electromechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures—such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information that typically is limited in size and/or complexity. For example, the term 'module' can signify one or more processes that transforms data and information, for example, processes comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules (e.g., a central processing unit, 'CPU'; an input/output ('I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('API') that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network. This process is discussed in the General Computer Explanation section.

DETAILED DESCRIPTION—SEMANTIC SUPPORT

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} used in commerce—or improves upon an existing commercial solution {see Diehr})—is precisely defined by the inventor(s) {see MPEP 2111.01 (9th edition, Rev. Aug. 2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art publications that can be combined {see Alice} by a skilled person {often referred to as a 'PHOSITA', see MPEP 2141-2144 (9th edition, Rev. Aug. 2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

DETAILED DESCRIPTION—CONCLUSION

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person. Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the Claims.

The foregoing embodiments have been presented for purposes of illustration and description. They are not intended to be exhaustive or to limit the scope of this disclosure to the forms disclosed. Accordingly, many modifications and variations will be apparent to practitioners skilled in the art. Additionally, the above disclosure is not intended to limit the disclosed subject matter. The scope of the claimed invention(s) is defined by the appended claims.

What is claimed is:

1. A non-transitory computer-readable medium comprising stored instructions, which when executed by a processor, cause the processor to:
    use a graphical user interface (GUI) to:
        display an integrated circuit (IC) design that includes a set of circuit objects associated with a net, and a group of icons corresponding to routing patterns;
        receive a selection of a subset of the set of circuit objects, and an icon from the group of icons;
        apply a routing pattern corresponding to the icon to the subset of the set of circuit objects to obtain a mapped topology, the mapped topology comprising a set of nodes corresponding to the subset of the set of circuit objects, and a set of edges corresponding to interconnections between the subset of the set of circuit objects; and
        display the mapped topology with the IC design; and
    provide the subset of the set of circuit objects and the routing pattern to a router.

2. The non-transitory computer-readable medium of claim 1, wherein the stored instructions, which when executed by the processor, cause the processor to:
    display an attribute editor that allows a user to input attribute values associated with the net; and
    receive a set of attribute values associated with the net.

3. The non-transitory computer-readable medium of claim 2, wherein the set of attribute values is provided to the router.

4. The non-transitory computer-readable medium of claim 2, wherein the input attribute values include physical, electrical, and/or connectivity attribute values.

5. The non-transitory computer-readable medium of claim 1, wherein the group of icons corresponding to the routing patterns comprises:
a first icon corresponding to a spanning tree routing pattern;
a second icon corresponding to a star routing pattern;
a third icon corresponding to a chain routing pattern; and
a fourth icon corresponding to a trunk routing pattern.

6. The non-transitory computer-readable medium of claim 1, wherein each circuit object in the set of circuit objects is either a pin or another routing intent.

7. The non-transitory computer-readable medium of claim 1, wherein said providing the subset of the set of circuit objects and the routing pattern to the router comprises generating a set of routing constraints based on the subset of the set of circuit objects and the routing pattern, and providing the set of routing constraints to the router.

8. A method comprising:
providing a graphical user interface (GUI) comprising an integrated circuit (IC) design that includes a set of circuit objects associated with a net, and a group of icons corresponding to routing patterns;
receiving a selection of a subset of the set of circuit objects, and an icon from the group of icons;
applying a routing pattern corresponding to the icon to the subset of the set of circuit objects to obtain a mapped topology, the mapped topology comprising a set of nodes corresponding to the subset of the set of circuit objects, and a set of edges corresponding to interconnections between the subset of the set of circuit objects;
providing the mapped topology with the IC design in the GUI; and
providing the subset of the set of circuit objects and the routing pattern to a router.

9. The method of claim 8, further comprising:
displaying an attribute editor that allows a user to input attribute values associated with the net; and
receiving a set of attribute values associated with the net.

10. The method of claim 9, wherein the set of attribute values is provided to the router.

11. The method of claim 9, wherein the input attribute values include physical, electrical, and/or connectivity attribute values.

12. The method of claim 8, wherein the group of icons corresponding to the routing patterns comprises:
a first icon corresponding to a spanning tree routing pattern;
a second icon corresponding to a star routing pattern;
a third icon corresponding to a chain routing pattern; and
a fourth icon corresponding to a trunk routing pattern.

13. The method of claim 8, wherein each circuit object in the set of circuit objects is either a pin or another routing intent.

14. The method of claim 8, wherein said providing the subset of the set of circuit objects and the routing pattern to the router comprises generating a set of routing constraints based on the subset of the set of circuit objects and the routing pattern, and providing the set of routing constraints to the router.

15. An apparatus, comprising:
a processor; and
a non-transitory computer-readable medium comprising stored instructions, which when executed by the processor, cause the processor to:
use a graphical user interface (GUI) to:
display an integrated circuit (IC) design that includes a set of circuit objects associated with a net, and a group of icons corresponding to routing patterns;
receive a selection of a subset of the set of circuit objects, and an icon from the group of icons;
apply a routing pattern corresponding to the icon to the subset of the set of circuit objects to obtain a mapped topology, the mapped topology comprising a set of nodes corresponding to the subset of the set of circuit objects, and a set of edges corresponding to interconnections between the subset of the set of circuit objects; and
display the mapped topology with the IC design; and
provide the subset of the set of circuit objects and the routing pattern to a router.

16. The apparatus of claim 15, wherein the stored instructions, which when executed by the processor, cause the processor to:
display an attribute editor that allows a user to input attribute values associated with the net; and
receive a set of attribute values associated with the net.

17. The apparatus of claim 16, wherein the set of attribute values is provided to the router.

18. The apparatus of claim 16, wherein the input attribute values include physical, electrical, and/or connectivity attribute values.

19. The apparatus of claim 15, wherein the group of icons corresponding to the routing patterns comprises:
a first icon corresponding to a spanning tree routing pattern;
a second icon corresponding to a star routing pattern;
a third icon corresponding to a chain routing pattern; and
a fourth icon corresponding to a trunk routing pattern.

20. The apparatus of claim 15, wherein each circuit object in the set of circuit objects is either a pin or another routing intent.

* * * * *